United States Patent
Kurita et al.

(10) Patent No.: US 7,651,315 B2
(45) Date of Patent: Jan. 26, 2010

(54) LARGE AREA SUBSTRATE TRANSFERRING METHOD FOR ALIGNING WITH HORIZONTAL ACTUATION OF LEVER ARM

(75) Inventors: Shinichi Kurita, San Jose, CA (US); Wendell T. Blonigan, Union City, CA (US); Yoshiaki Tanase, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 11/621,039

(22) Filed: Jan. 8, 2007

(65) Prior Publication Data

US 2007/0140814 A1    Jun. 21, 2007

Related U.S. Application Data

(62) Division of application No. 10/832,795, filed on Apr. 26, 2004, now Pat. No. 7,207,766.

(60) Provisional application No. 60/512,727, filed on Oct. 20, 2003.

(51) Int. Cl.
*B65G 47/90* (2006.01)
*B21B 39/22* (2006.01)

(52) U.S. Cl. .................. 414/816; 414/771; 414/775; 414/936

(58) Field of Classification Search .................. 414/217, 414/937, 939, 941, 774, 754, 777, 779; 901/47
See application file for complete search history.

(56) References Cited

U.S. PATENT DOCUMENTS

| | | | |
|---|---|---|---|
| 3,976,330 A | | 8/1976 | Babinski et al. |
| 4,047,624 A | | 9/1977 | Dorenbos |
| 4,178,113 A | | 12/1979 | Beaver, II et al. |
| 4,311,542 A | | 1/1982 | Mueller et al. |
| 4,512,391 A | | 4/1985 | Harra |
| 4,655,584 A | * | 4/1987 | Tanaka et al. ................ 355/53 |
| 4,680,061 A | | 7/1987 | Lamont, Jr. |
| 4,687,542 A | | 8/1987 | Davis et al. |

(Continued)

FOREIGN PATENT DOCUMENTS

EP    0 359 525    3/1990

(Continued)

OTHER PUBLICATIONS

Chinese First Office Action dated Nov. 17, 2006 for Chinese Application No. 200410098143.7.

(Continued)

*Primary Examiner*—Gregory W Adams
(74) *Attorney, Agent, or Firm*—Patterson & Sheridan, LLP

(57) ABSTRACT

A load lock chamber and method for transferring large area substrates is provided. In one embodiment, a load lock chamber suitable for transferring large area substrates includes a plurality of vertically stacked single substrate transfer chambers. The configuration of vertically stacked single substrate transfer chambers contributes to reduced size and greater throughput as compared to conventional state of the art, dual slot dual substrate designs. Moreover, the increased throughput has been realized at reduced pumping and venting rates, which corresponds to reduced probability of substrate contamination due to particulates and condensation.

20 Claims, 9 Drawing Sheets

U.S. PATENT DOCUMENTS

| | | | |
|---|---|---|---|
| 4,693,777 A | 9/1987 | Hazano et al. | |
| 4,709,655 A | 12/1987 | Van Mastrigt | |
| 4,759,681 A | 7/1988 | Nogami | |
| 4,770,590 A | 9/1988 | Hugues et al. | |
| 4,775,281 A | 10/1988 | Prentakis | |
| 4,784,377 A | 11/1988 | Woodward | |
| 4,785,962 A | 11/1988 | Toshima | |
| 4,801,241 A | 1/1989 | Zajac et al. | |
| 4,816,098 A | 3/1989 | Davis et al. | |
| 4,828,224 A | 5/1989 | Crabb et al. | |
| 4,836,733 A | 6/1989 | Hertel et al. | |
| 4,846,102 A | 7/1989 | Ozias | |
| 4,857,689 A | 8/1989 | Lee | |
| 4,863,547 A | 9/1989 | Shidahara et al. | |
| 4,870,923 A | 10/1989 | Sugimoto | |
| 4,880,349 A * | 11/1989 | Woodward | 29/743 |
| 4,895,107 A | 1/1990 | Yano et al. | |
| 4,911,103 A | 3/1990 | Davis et al. | |
| 4,913,929 A | 4/1990 | Moslehi et al. | |
| 4,923,584 A | 5/1990 | Bramhall, Jr. et al. | |
| 4,951,601 A | 8/1990 | Maydan et al. | |
| 4,952,299 A | 8/1990 | Chrisos et al. | |
| 4,966,519 A | 10/1990 | Davis et al. | |
| 4,989,543 A | 2/1991 | Schmitt | |
| 4,990,047 A | 2/1991 | Wagner et al. | |
| 5,001,327 A | 3/1991 | Hirasawa et al. | |
| 5,020,475 A | 6/1991 | Crabb et al. | |
| 5,044,871 A | 9/1991 | Davis et al. | |
| 5,046,909 A * | 9/1991 | Murdoch | 294/113 |
| 5,060,354 A | 10/1991 | Chizinsky | |
| 5,131,460 A | 7/1992 | Krueger | |
| 5,186,718 A | 2/1993 | Tepman et al. | |
| 5,187,115 A | 2/1993 | Coleman | |
| 5,199,483 A | 4/1993 | Bahng | |
| 5,202,716 A | 4/1993 | Tateyama et al. | |
| 5,224,809 A | 7/1993 | Maydan et al. | |
| 5,227,708 A | 7/1993 | Lowrance | |
| 5,252,807 A | 10/1993 | Chizinsky | |
| 5,254,170 A | 10/1993 | Devibiss et al. | |
| 5,259,881 A | 11/1993 | Edwards et al. | |
| 5,259,883 A | 11/1993 | Yamabe et al. | |
| 5,261,935 A | 11/1993 | Ishii et al. | |
| 5,288,379 A | 2/1994 | Namiki et al. | |
| 5,292,393 A | 3/1994 | Maydan et al. | |
| 5,352,294 A | 10/1994 | White et al. | |
| 5,355,066 A | 10/1994 | Lowrance | |
| 5,374,147 A | 12/1994 | Hiroki et al. | |
| 5,376,212 A | 12/1994 | Saiki | |
| 5,404,894 A | 4/1995 | Shiraiwa | |
| 5,421,889 A | 6/1995 | Pollock et al. | |
| 5,443,346 A | 8/1995 | Murata et al. | |
| 5,445,484 A | 8/1995 | Kato et al. | |
| 5,447,409 A | 9/1995 | Grunes et al. | |
| 5,464,313 A | 11/1995 | Ohsawa | |
| 5,469,035 A | 11/1995 | Lowrance | |
| 5,470,784 A | 11/1995 | Coleman | |
| 5,474,410 A | 12/1995 | Ozawa et al. | |
| 5,512,320 A | 4/1996 | Turner et al. | |
| 5,516,732 A | 5/1996 | Flegal | |
| 5,536,128 A | 7/1996 | Shimoyashiro et al. | |
| 5,558,482 A * | 9/1996 | Hiroki et al. | 414/217 |
| 5,562,383 A | 10/1996 | Iwai et al. | |
| 5,570,994 A | 11/1996 | Somekh et al. | |
| 5,586,585 A | 12/1996 | Bonora et al. | |
| 5,588,827 A | 12/1996 | Muka | |
| 5,607,009 A | 3/1997 | Turner et al. | |
| 5,609,689 A | 3/1997 | Kato et al. | |
| 5,611,655 A | 3/1997 | Fukasawa et al. | |
| 5,611,865 A | 3/1997 | White et al. | |
| 5,615,988 A | 4/1997 | Wiesler et al. | |
| 5,616,208 A | 4/1997 | Lee | |
| 5,636,964 A | 6/1997 | Somekh et al. | |
| 5,655,277 A | 8/1997 | Galdos et al. | |
| 5,674,786 A | 10/1997 | Turner et al. | |
| 5,685,684 A | 11/1997 | Kato et al. | |
| 5,695,568 A | 12/1997 | Sinha et al. | |
| 5,697,749 A | 12/1997 | Iwabuchi et al. | |
| 5,700,127 A | 12/1997 | Harada et al. | |
| 5,716,207 A | 2/1998 | Mishina et al. | |
| 5,738,767 A | 4/1998 | Coad et al. | |
| 5,751,003 A | 5/1998 | Rose et al. | |
| 5,784,799 A | 7/1998 | Kato et al. | |
| 5,793,050 A | 8/1998 | Rose et al. | |
| 5,795,355 A | 8/1998 | Moran | |
| 5,820,679 A | 10/1998 | Yokoyama et al. | |
| 5,833,426 A | 11/1998 | Marohl | |
| 5,855,681 A | 1/1999 | Maydan et al. | |
| 5,855,726 A | 1/1999 | Soraoka et al. | |
| 5,882,165 A | 3/1999 | Maydan et al. | |
| 5,884,009 A | 3/1999 | Okase | |
| 5,891,251 A | 4/1999 | MacLeish et al. | |
| 5,902,088 A | 5/1999 | Fairbairn et al. | |
| 5,909,994 A | 6/1999 | Blum et al. | |
| 5,913,978 A | 6/1999 | Kato et al. | |
| 5,934,856 A | 8/1999 | Asakawa et al. | |
| 5,942,013 A | 8/1999 | Akimoto | |
| 5,944,857 A | 8/1999 | Edwards et al. | |
| 5,951,770 A | 9/1999 | Perlov et al. | |
| 5,954,472 A | 9/1999 | Hofmeister et al. | |
| 5,961,269 A | 10/1999 | Kroeker | |
| 5,989,346 A | 11/1999 | Hiroki | |
| 5,997,235 A | 12/1999 | Hofmeister | |
| 6,007,675 A | 12/1999 | Toshima | |
| 6,012,192 A | 1/2000 | Sawada et al. | |
| 6,016,611 A | 1/2000 | White et al. | |
| 6,034,000 A | 3/2000 | Heyder et al. | |
| 6,039,770 A | 3/2000 | Yang et al. | |
| 6,042,623 A | 3/2000 | Edwards | |
| 6,044,534 A | 4/2000 | Seo et al. | |
| 6,048,154 A | 4/2000 | Wytman | |
| 6,059,507 A | 5/2000 | Adams | |
| 6,079,693 A | 6/2000 | Ettinger et al. | |
| 6,082,950 A | 7/2000 | Altwood et al. | |
| 6,086,362 A | 7/2000 | White et al. | |
| 6,106,634 A | 8/2000 | Ghanayem et al. | |
| 6,143,083 A | 11/2000 | Yonemitsu et al. | |
| 6,145,673 A | 11/2000 | Burrows et al. | |
| 6,176,667 B1 | 1/2001 | Fairbairn et al. | |
| 6,176,668 B1 | 1/2001 | Kurita et al. | |
| 6,190,997 B1 * | 2/2001 | Becker et al. | 438/401 |
| 6,193,507 B1 | 2/2001 | White et al. | |
| 6,206,176 B1 | 3/2001 | Blonigan | |
| 6,213,704 B1 | 4/2001 | White et al. | |
| 6,215,897 B1 | 4/2001 | Beer et al. | |
| 6,224,680 B1 | 5/2001 | Toshima | |
| 6,235,634 B1 | 5/2001 | White et al. | |
| 6,254,328 B1 | 7/2001 | Wytman | |
| 6,270,582 B1 | 8/2001 | Rivkin et al. | |
| 6,286,230 B1 | 9/2001 | White et al. | |
| 6,296,735 B1 * | 10/2001 | Marxer et al. | 156/345.32 |
| 6,315,512 B1 | 11/2001 | Tabrizi et al. | |
| 6,318,945 B1 | 11/2001 | Hofmeister | |
| 6,338,626 B1 | 1/2002 | Saeki | |
| 6,340,405 B2 | 1/2002 | Park | |
| 6,382,895 B1 | 5/2002 | Konishi et al. | |
| 6,410,455 B1 | 6/2002 | Kuribayashi et al. | |
| 6,431,807 B1 | 8/2002 | Stevens et al. | |
| 6,435,868 B2 | 8/2002 | White et al. | |
| 6,450,750 B1 | 9/2002 | Heyder et al. | |
| 6,486,444 B1 | 11/2002 | Fairbairn et al. | |
| 6,503,365 B1 | 1/2003 | Kim et al. | |
| 6,517,303 B1 | 2/2003 | White et al. | |
| 6,558,509 B2 | 5/2003 | Kraus et al. | |
| 6,568,552 B1 | 5/2003 | Tabrizi et al. | |

| | | | | | | |
|---|---|---|---|---|---|---|
| 6,568,899 | B1 | 5/2003 | Kuribayashi et al. | JP | 08-264452 | 10/1996 |
| 6,602,797 | B2 | 8/2003 | Kuribayashi et al. | JP | 09-027536 | 1/1997 |
| 6,609,869 | B2 | 8/2003 | Aggarwal et al. | JP | 09027536 | 1/1997 |
| 6,610,150 | B1 | 8/2003 | Savage et al. | JP | 09-223727 | 8/1997 |
| 6,647,665 | B1 | 11/2003 | Tabrizi et al. | JP | 10-107126 | 4/1998 |
| 6,902,624 | B2 | 6/2005 | Seidel et al. | JP | 2000-150395 | 5/2000 |
| 6,949,143 | B1 | 9/2005 | Kurita et al. | JP | 00-195925 | 7/2000 |
| 7,104,535 | B2 * | 9/2006 | Kurita et al. ............. 269/303 | JP | 2000-323551 | 11/2000 |
| 7,207,766 | B2 * | 4/2007 | Kurita et al. ............. 414/937 | KR | 199917722 | 6/1999 |
| 2002/0034886 | A1 | 3/2002 | Kurita et al. | KR | 2000-35354 | 6/2000 |
| 2002/0137346 | A1 | 9/2002 | Donaldson et al. | KR | 200035354 | 6/2000 |
| 2002/0159864 | A1 | 10/2002 | Lowrance | WO | WO 99/13504 | 4/1999 |
| 2004/0149210 | A1 | 8/2004 | Fink | WO | WO 99/18603 | 4/1999 |
| 2005/0095088 | A1 | 5/2005 | Kurita et al. | WO | WO 99/59928 | 11/1999 |

FOREIGN PATENT DOCUMENTS

| | | |
|---|---|---|
| EP | 0 607 797 | 7/1994 |
| EP | 0 608 620 | 8/1994 |
| EP | 0 608 633 | 8/1994 |
| EP | 0 684 630 | 11/1995 |
| EP | 0 756 316 | 1/1997 |
| EP | 0 935 279 | 8/1999 |
| JP | 64-028933 | 1/1989 |
| JP | 02-152251 | 6/1990 |
| JP | 03-136345 | 6/1991 |
| JP | 03-274746 | 12/1991 |
| JP | 04-098848 | 3/1992 |
| JP | 04-240721 | 8/1992 |
| JP | 05-013551 | 1/1993 |
| JP | 05-179447 | 7/1993 |
| JP | 05182891 A * | 7/1993 |
| JP | 05-283500 | 10/1993 |
| JP | 06-104326 | 4/1994 |
| JP | 06-156624 | 6/1994 |
| JP | 06-163505 | 6/1994 |
| JP | 07-086169 | 3/1995 |
| WO | WO 99/60609 | 11/1999 |
| WO | WO 99/60610 | 11/1999 |
| WO | WO 99/60611 | 11/1999 |
| WO | WO 99/60612 | 11/1999 |
| WO | WO 99/61350 | 12/1999 |
| WO | WO 02/23597 A2 | 3/2002 |
| WO | 03073479 | 9/2003 |
| WO | WO 03/073479 | 9/2003 |

OTHER PUBLICATIONS

"Dry Etching Systems: Gearing Up for Larger Wafers," Semiconductor International, Oct. 1985, pp. 49-60.
Declaration of Thomas B. Brezocsky dated Jan. 29, 1999.
Decision of Rejection for Japanese Patent Application No. 2004-306067 dated Jan. 8, 2009.
Korean Office Action, Application No. 10-2004-0083492, dated Sep. 22, 2008.
Prosecution history of U.S. Appl. No. 11/332,781, filed Jun. 11, 2009.
Prosecution history of U.S. Appl. No. 10/832,795, filed Jun. 11, 2009.
Official letter dated Mar. 24, 2009 from Korean Patent Office for corresponding Korean Patent Application No. 10-2004-0083492.

* cited by examiner

LARGE AREA SUBSTRATE TRANSFERRING METHOD FOR ALIGNING WITH HORIZONTAL ACTUATION OF LEVER ARM

CROSS-REFERENCE TO RELATED APPLICATIONS

This application is a division of co-pending U.S. patent application Ser. No. 10/832,795 (APPM/008726), entitled "LOAD LOCK CHAMBER FOR LARGE AREA SUBSTRATE PROCESSING SYSTEM", filed Apr. 26, 2004, now U.S. Pat. NO. 7,207,766 which application claims benefit of U.S. Provisional Application Ser. No. 60/512,727 (APPM/008726L), entitled "LOAD LOCK CHAMBER FOR LARGE AREA SUBSTRATE PROCESSING SYSTEM", filed Oct. 20, 2003, both of which are hereby incorporated by reference in their entirety.

BACKGROUND OF THE INVENTION

1. Field of the Invention

Embodiments of the invention generally relate to a load lock chamber for transferring large area substrates into a vacuum processing system and methods of operation of the same.

2. Description of the Related Art

Thin film transistors (TFT) are commonly used for active matrix displays such as computer and television monitors, cell phone displays, personal digital assistants (PDAs), and an increasing number of other devices. Generally, flat panels comprise two glass plates having a layer of liquid crystal materials sandwiched therebetween. At least one of the glass plates includes one conductive film disposed thereon that is coupled to a power source. Power, supplied to the conductive film from the power source, changes the orientation of the crystal material, creating a pattern display.

With the marketplace's acceptance of flat panel technology, the demand for larger displays, increased production and lower manufacturing costs have driven equipment manufacturers to develop new systems that accommodate larger size glass substrates for flat panel display fabricators. Current glass processing equipment is generally configured to accommodate substrates up to about one square meter. Processing equipment configured to accommodate substrate sizes up to and exceeding 1½ square meters is envisioned in the immediate future.

Equipment to fabricate such large substrates represents a substantial investment to flat panel display fabricators. Conventional systems require large and expensive hardware. In order to offset this investment, high substrate throughput is highly desirable.

FIG. 9 is a simplified schematic of a double dual slot load lock chamber 900 available from AKT™, a wholly owned division of Applied Materials Inc., located in Santa Clara, Calif., that is currently capable of transferring 1500×1800 mm substrates at a rate of about 60 substrates per hour. The load lock chamber 900 includes two substrate transfer chambers 902, 904 formed in a chamber body 906. Each substrate transfer chamber 902, 904 has an interior volume of about 800 liters. Two substrates 910 are disposed on an elevator 912 that is vertically movable within the chamber 902, 904 to facilitate exchange of the substrates with transfer robots (not shown).

To achieve high substrate throughput, load lock chambers, such as the one described above, require high capacity vacuum pumps and venting systems. However, increasing the throughput of such high volume load lock chambers is challenging. Simply increasing the pumping and venting speeds does not provide an acceptable solution as high pumping speeds may contribute to particulate contamination of the substrate within the load lock chamber. Moreover, as cleanrooms generally operate at humidity levels greater than 50 percent to minimize static electricity, rapid venting of the load lock chamber may undesirably result in condensation of water vapor within the load lock chamber. As future processing systems are envisioned to process even larger size substrates, the need for improved load lock chambers capable of rapid transfer of large area substrates is of increasing concern.

Thus, there is a need for an improved load lock chamber for large area substrates.

SUMMARY OF THE INVENTION

A load lock chamber and method for transferring large area substrates is provided. In one embodiment, a load lock chamber suitable for transferring large area substrates includes a plurality of vertically stacked single substrate transfer chambers. In another embodiment, a load lock chamber suitable for transferring large area substrates includes a chamber body having a first side adapted for coupling to a vacuum chamber and a second side adapted for coupling to a factory interface. The chamber body includes N vertically stacked substrate transfer chambers formed therein, where N is an integer greater than two. Adjacent substrate transfer chambers are separated and environmentally isolated by a substantially horizontal interior wall.

BRIEF DESCRIPTION OF THE DRAWINGS

So that the manner in which the above recited features of the invention are attained and can be understood in detail, a more particular description of the invention, briefly summarized above, may be had by reference to the embodiments thereof which are illustrated in the appended drawings. It is to be noted, however, that the appended drawings illustrate only typical embodiments of this invention and are therefore not to be considered limiting of its scope, for the invention may admit to other equally effective embodiments.

To facilitate understanding, identical reference numerals have been used, wherever possible, to designate identical elements that are common to the figures.

DETAILED DESCRIPTION

The invention generally provides a high volume/high throughput load lock chamber having multiple stacked substrate transfer chambers. The invention is illustratively described below utilized in a flat panel processing system, such as those available from AKT, a division of Applied Materials, Inc., Santa Clara, Calif. However, it should be understood that the invention has utility in other system configurations, wherever high throughput substrate transfer through a load lock chamber of large area substrates is desired.

Figure 1:
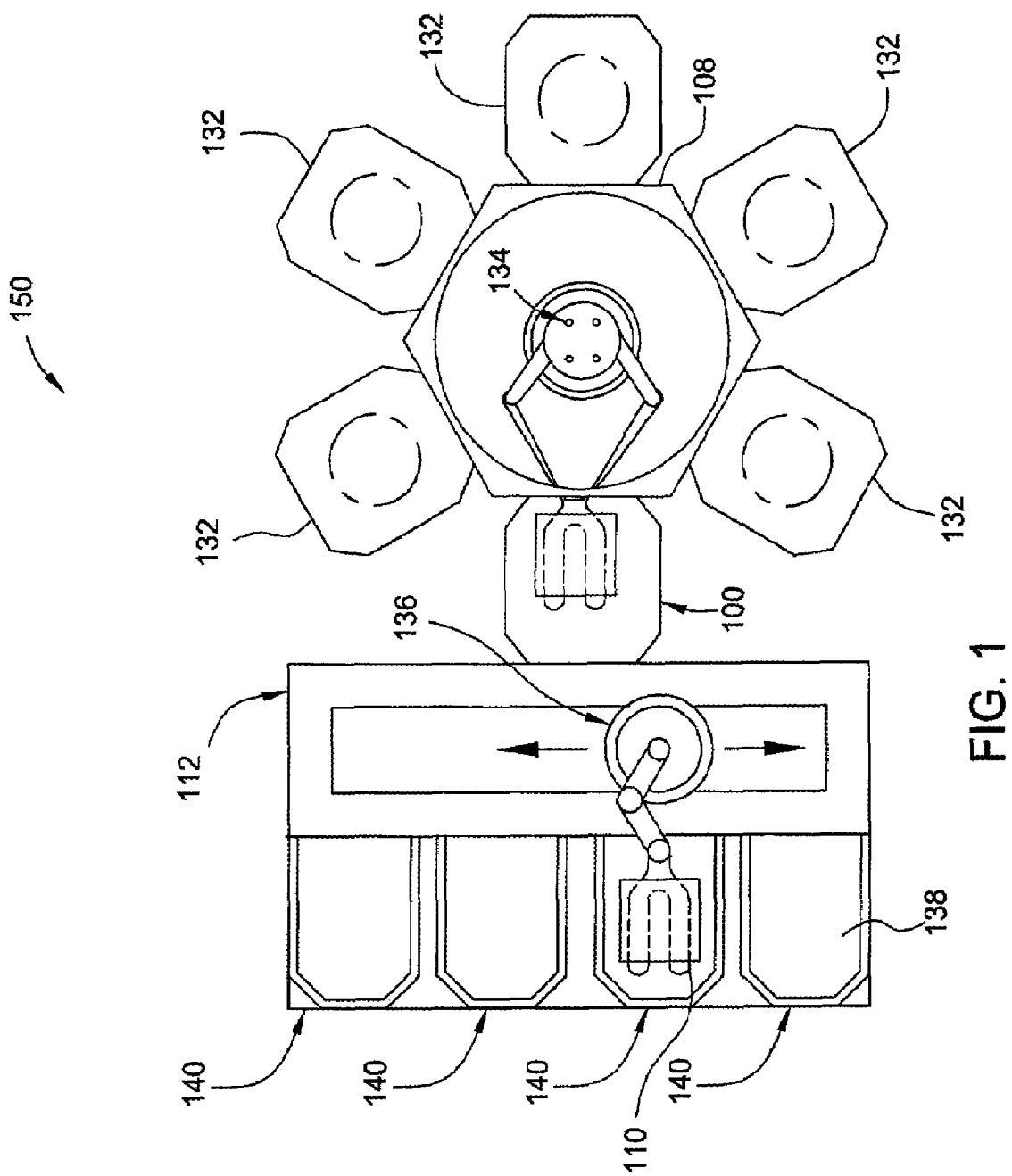
FIG. 1 is a top plan view of one embodiment of a processing system for processing large area substrates.

FIG. 1 is a top plan view of one embodiment of a process system 150 suitable for processing large area substrates (e.g., substrates having a plan area greater than about 2.7 square meters). The process system 150 typically includes a transfer chamber 108 coupled to a factory interface 112 by a load lock chamber 100 having a plurality of single substrate transfer chambers. The transfer chamber 108 has at least one dual blade vacuum robot 134 disposed therein that is adapted to transfer substrates between a plurality of circumscribing process chambers 132 and the load lock chamber 100. In one embodiment, one of the process chambers 132 is a pre-heat chamber that thermally conditions substrates prior to processing to enhance throughput of the system 150. Typically, the transfer chamber 108 is maintained at a vacuum condition to eliminate the necessity of adjusting the pressures between the transfer chamber 108 and the individual process chambers 132 after each substrate transfer.

The factory interface 112 generally includes a plurality of substrate storage cassettes 138 and a dual blade atmospheric robot 136. The cassettes 138 are generally removably disposed in a plurality of bays 140 formed on one side of the factory interface 112. The atmospheric robot 136 is adapted to transfer substrates 110 between the cassettes 138 and the load lock chamber 100. Typically, the factory interface 112 is maintained at or slightly above atmospheric pressure.

Figure 2:
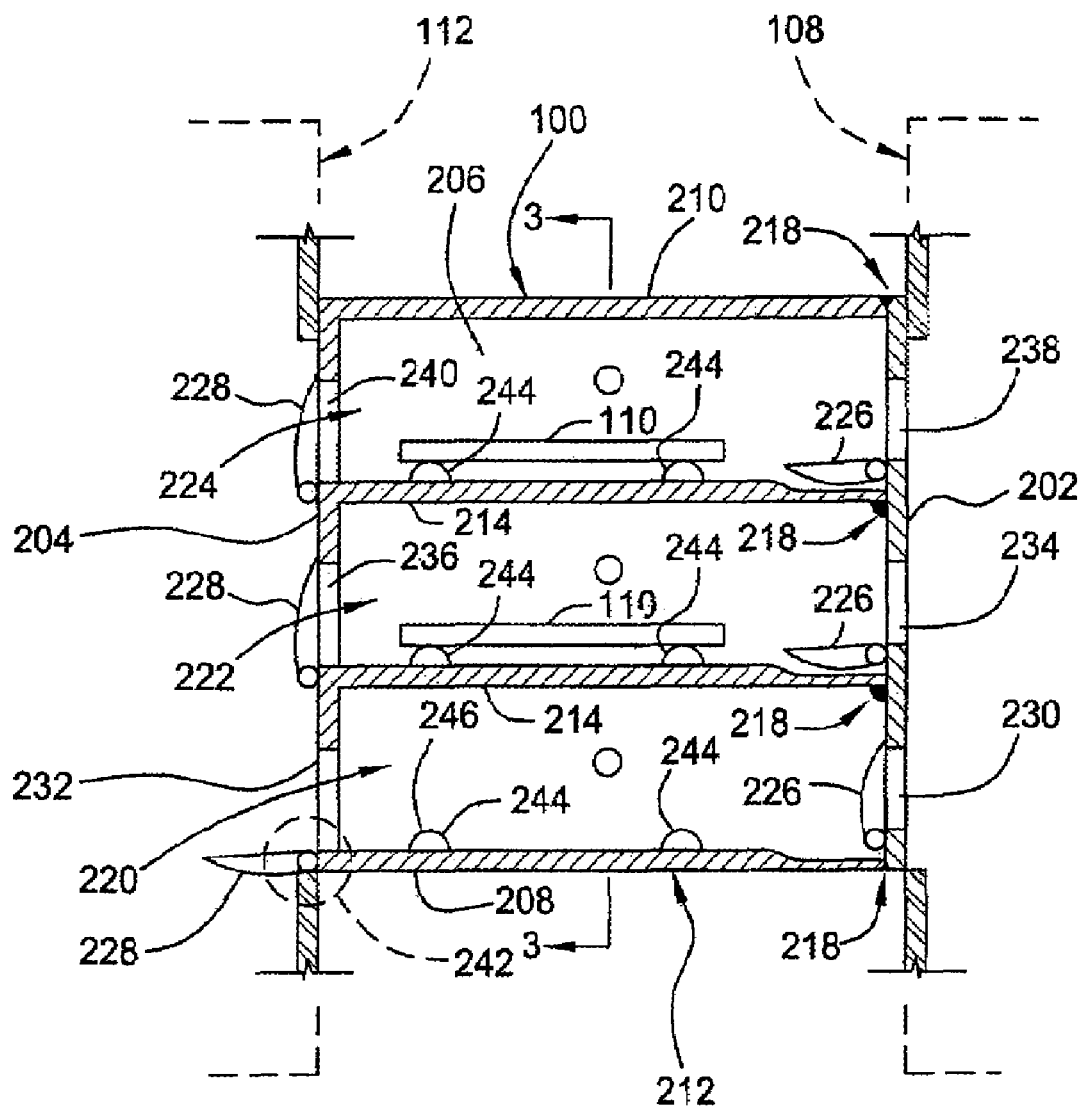
FIG. 2 is a side sectional view of one embodiment of a multiple chamber load lock chamber.

FIG. 2 is a sectional view of one embodiment of the multi-chamber load lock 100 of FIG. 1. The load lock chamber 100 has a chamber body 212 that includes a plurality of vertically-stacked, environmentally-isolated substrate transfer chambers that are separated by vacuum-tight, horizontal interior walls 214. Although three single substrate transfer chambers 220, 222, 224 are shown in the embodiment depicted in FIG. 2, it is contemplated that the chamber body 212 of load lock chamber 100 may include two or more vertically-stacked substrate transfer chambers. For example, the load lock chamber 100 may include N substrate transfer chambers separated by N-1 horizontal interior walls 214, where N is an integer greater than one.

The substrate transfer chambers 220, 222, 224 are each configured to accommodate a single large area substrate 110 so that the volume of each chamber may be minimized to enhance fast pumping and vent cycles. In the embodiment depicted in FIG. 2, each substrate transfer chamber 220, 222, 224 has an interior volume of equal to or less than about 1000 liters to accommodate substrates having a plan surface area of about 2.7 square meters. For comparison, a dual slot dual substrate transfer chamber of a conventional design 900 (shown in FIG. 9) has an interior volume of about 1600 liters. It is contemplated that a substrate transfer chamber of the present invention having a greater width and/or length and equal height may be configured to accommodate even larger substrates.

The chamber body 212 includes a first sidewall 202, a second sidewall 204, a third sidewall 206, a bottom 208 and a top 210. A fourth sidewall 302 is shown opposite the third sidewall 206 in FIG. 3. The body 212 is fabricated from a rigid material suitable for use under vacuum conditions. In one embodiment, the chamber body 212 is fabricated from a single block (e.g., one piece) of aluminum. Alternatively, the chamber body 212 may be fabricated from modular sections, each modular section generally comprising a portion of one of the substrate transfer chambers 220, 222, 224, and assembled in a fashion suitable to maintain vacuum integrity, such as continuous welds shown by reference numeral 218.

In the embodiment depicted in FIG. 2, the interior walls 214 and the remaining portions of the chamber body 212 other than the second sidewall 206 are fabricated from a single contiguous mass of material. The second sidewall 206 is sealably coupled to the other portions of the chamber body 212 to facilitate machining of the substrate transfer chambers 220, 222, 224 and to allow access to the interior portions of the chamber body 212 during fabrication and assembly.

Alternatively, the horizontal walls 214 of the chamber body 212 may be vacuum sealed to sidewalls of the chamber body 212, thereby isolating the substrate transfer chambers 220, 222, 224. For example, the horizontal walls 214 may be continuously welded to the chamber body 212 to allow greater access to the entire interior of the chamber body 212 during early assembly stages of the load lock chamber 100.

Each of the substrate transfer chambers 220, 222, 224 defined in the chamber body 212 includes two substrate access ports. The ports are configured to facilitate the entry and egress of large area substrates 110 from the load lock chamber 100. In the embodiment depicted in FIG. 2, the first substrate transfer chamber 220 disposed at the bottom 208 of the chamber body 212 includes a first substrate access port 230 and a second substrate access port 232 having a width greater than 2000 mm. The first substrate access port 230 is formed through the first sidewall 202 of the chamber body 212 and couples the first substrate transfer chamber 220 to the central transfer chamber 108 of the processing system 150. The second substrate access port 232 is formed through the second wall 204 of the chamber body 212 and couples the first substrate transfer chamber 220 to the factory interface 112. In the embodiment depicted in FIG. 2, the substrate access ports 230, 232 are disposed on opposite sides of the chamber body 212, however, the ports 230, 232 may alternatively be positioned on adjacent walls of the body 212.

Each of the substrate access ports 230, 232 is selectively sealed by a respective slit valve 226, 228 adapted to selectively isolate the first substrate transfer chamber 220 from the environments of the transfer chamber 108 and the factory interface 112. The slit valves 226, 228 are moved between an open and closed position by an actuator 242 (one actuator 242 shown in phantom in FIG. 2 is normally positioned outside the chamber body 212). In the embodiment depicted in FIG. 2, each of the slit valves 226, 228 is pivotally coupled to the chamber body 212 along a first edge and rotated between the open and closed position by the actuator 242.

The first slit valve 226 seals the first substrate access port 230 from the interior side of the first sidewall 202 and is thereby positioned within the first substrate transfer chamber 220 such that a vacuum (e.g., pressure) differential between the first substrate transfer chamber 220 and the vacuum environment of the central transfer chamber 108 assists in loading and sealing the slit valve 226 against the first sidewall 202, thereby enhancing the vacuum seal. Correspondingly, the second slit valve 228 is disposed on the exterior of the second sidewall 204 and is thereby positioned such that the pressure differential between the ambient environment of the factory interface 112 and the vacuum environment of the first substrate transfer chamber 220 assists in sealing the second substrate access port 232. Examples of slit valves that may be adapted to benefit from the invention are described in U.S. Pat. No. 5,579,718, issued Dec. 3, 1996 to Freerks and U.S. Pat. No. 6,045,620, issued Apr. 4, 2000 to Tepman et al., both of which are hereby incorporated by reference in their entireties.

The second substrate transfer chamber 222 is similarly configured with access ports 234, 236 and slit valves 226, 228. The third substrate transfer chamber 224 is similarly configured with access ports 238, 240 and slit valves 226, 228.

The substrate 110 is supported above the bottom 208 of the first substrate transfer chamber 220 and the interior walls 214 bounding the bottom of the second and third substrate transfer chambers 222, 224 by a plurality of substrate supports 244. The substrate supports 244 are configured and spaced to support the substrate 110 at an elevation above the bottom 208 (or walls 214) to avoid contact of the substrate with the chamber body 212. The substrate supports 244 are configured to minimize scratching and contamination of the substrate. In the embodiment depicted in FIG. 2, the substrate supports 244 are stainless pins having a rounded upper end 246. Other suitable substrate supports are described in U.S. Pat. No. 6,528,767, filed Mar. 4, 2003; U.S. patent application Ser. No. 09/982,406, filed Oct. 17, 2001, published as United States Patent Publication No. 2003/0072639 A1; and U.S. patent application Ser. No. 10/376,857, filed Feb. 27, 2003, published as United States Patent Publication No. 2004/0170407 A1, all of which are incorporated by reference in their entireties.

Figure 3:
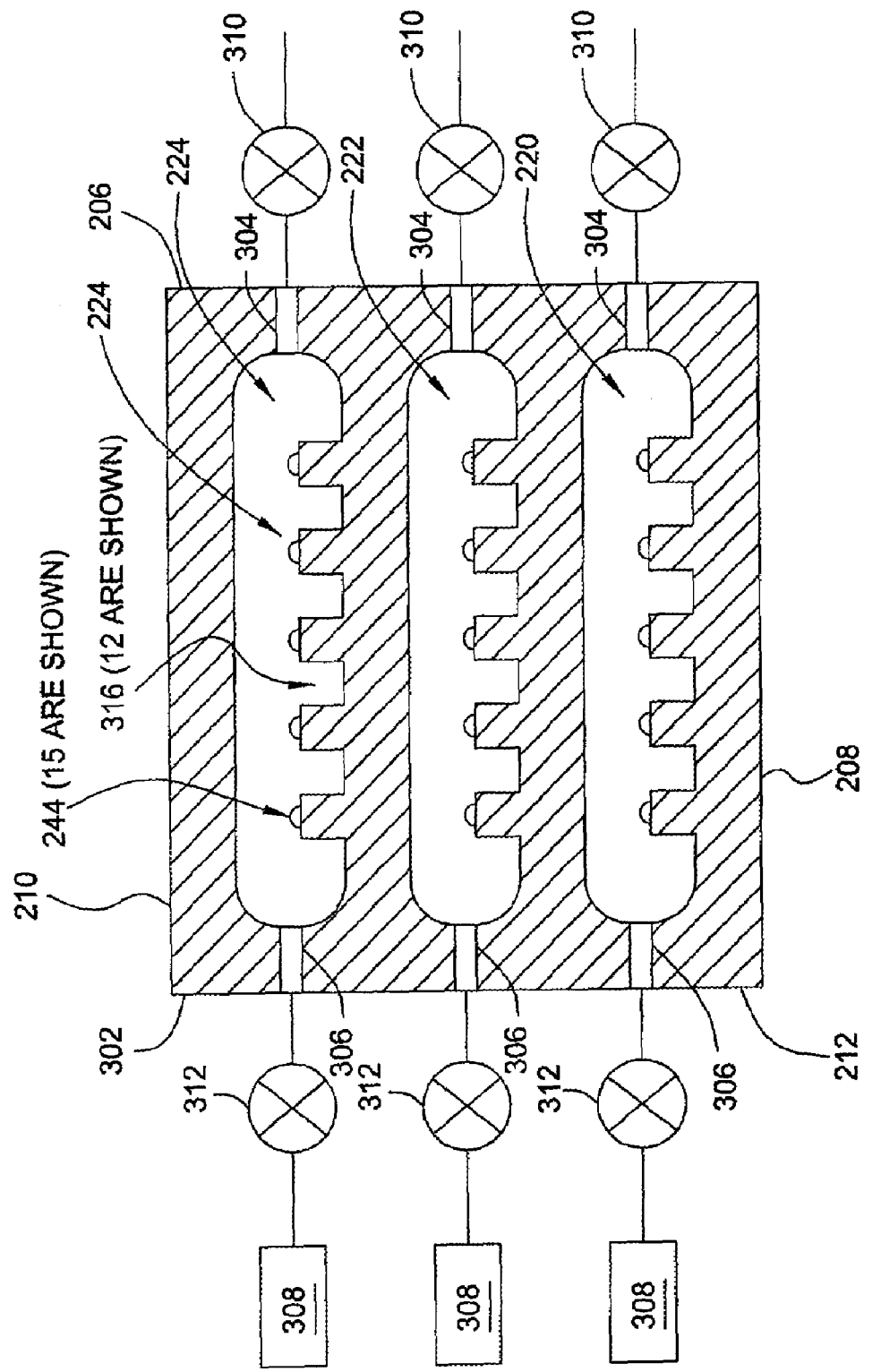
FIG. 3 is a sectional view of the load lock chamber taken along section lines 3-3 of FIG. 2.

FIG. 3 is a sectional view of the load lock chamber 100 taken along section line 3-3 of FIG. 2. The sidewalls of each of the substrate transfer chambers 220, 222, 224 includes at least one port disposed therethrough to facilitate controlling the pressure within the interior volume of each chamber. In the embodiment depicted in FIG. 3, the chamber body 212 includes a vent port 306 formed through the fourth sidewall 302 and a vacuum port 306 formed through the third sidewall 206 of the chamber body 212 for venting and pumping down of the first substrate transfer chamber 220. Valves 310, 312 are respectfully coupled to the vent port 304 and vacuum port 306 to selectively prevent flow therethrough. The vacuum port 306 is coupled to a vacuum pump 308 that is utilized to selectively lower the pressure within the interior volume of the first substrate transfer chamber 220 to a level that substantially matches the pressure of the transfer chamber 108.

Referring additionally to FIG. 2, when the pressures between the transfer chamber 108 and the first substrate transfer chamber 220 of the load lock chamber 100 are substantially equal, the slit valve 226 may be opened to allow processed substrates to be transferred to the load lock chamber 100 and substrates to be processed transferred to the transfer chamber 108 by the vacuum robot 134 through the first substrate access port 230. After placing the substrate returning from the transfer chamber 108 in the first substrate transfer chamber 220 of the load lock chamber 100, the slit valve 226 is closed and the valve 310 is opened thereby allowing venting gas, for example $N_2$ and/or He, into the first substrate transfer chamber 220 of the load lock chamber 100 through the vent port and raising the pressure within the internal volume 110. Typically, the venting gas entering the interior volume 110 through the vent port 304 is filtered to minimize potential particulate contamination of the substrate. Once the pressure within the first substrate transfer chamber 220 is substantially equal to that of the factory interface 112, the slit valve 224 opens, thus allowing the atmospheric robot 136 to transfer substrates between the first substrate transfer chamber 220 and the substrate storage cassettes 138 coupled to the factory interface 112 through the second substrate access port 232.

The other substrate transfer chambers 222, 224 are similarly configured. Although each of the substrate transfer chambers 220, 222, 224 are shown in FIG. 3 with individual pumps 308, one or more of the substrate transfer chambers 220, 222, 224 may share a single vacuum pump equipped with appropriate flow controls to facilitate selective pumping between chambers as shown in FIG. 3A.

Figure 9:
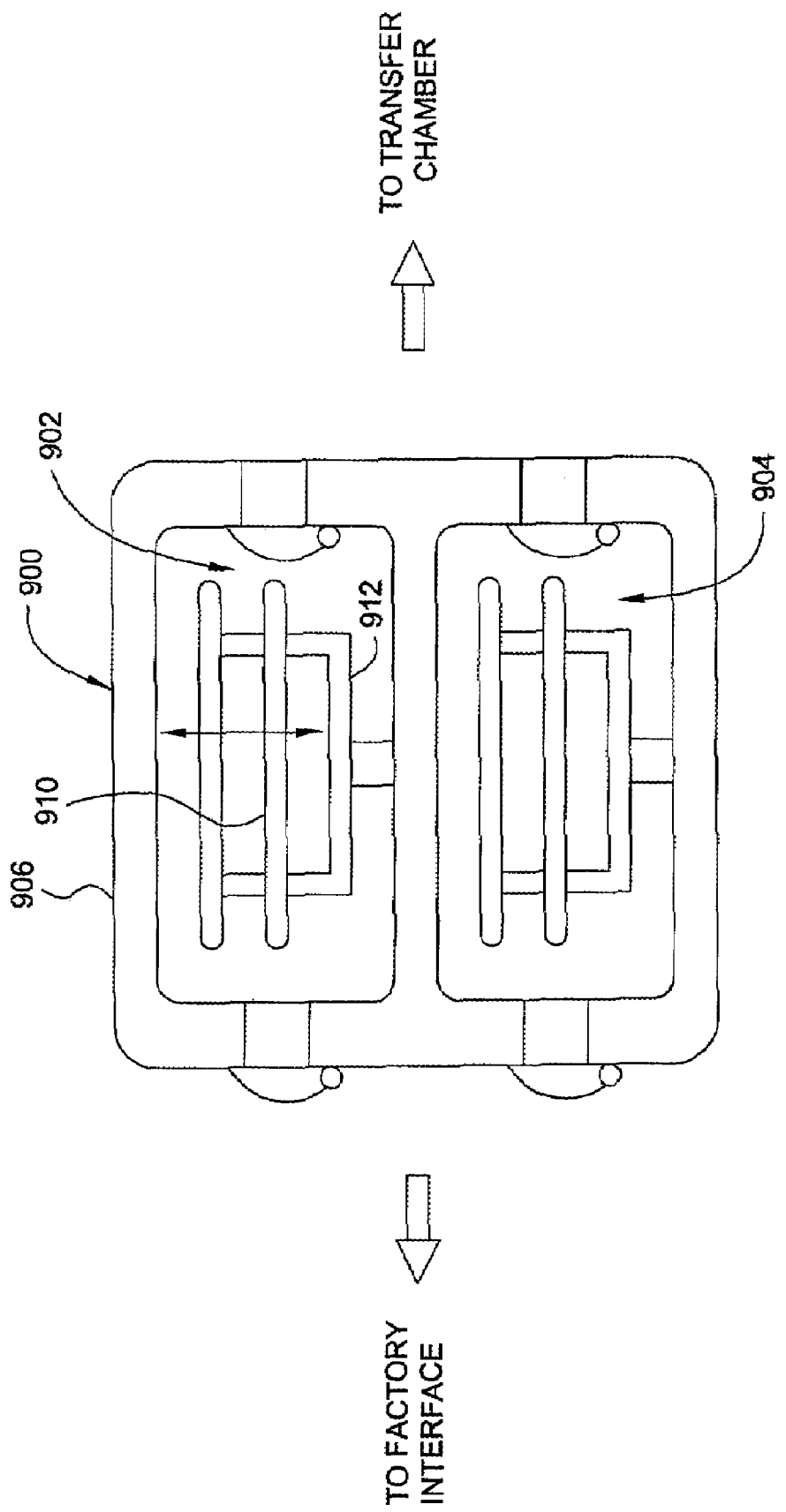
FIG. 9 is one embodiment of a conventional dual slot dual substrate load lock chamber of the prior art.

As the substrate transfer chambers 220, 224, 226 are configured with less than or equal to about 1000 liters of volume, the load lock chamber 100 may transfer about 70 substrates per hour at a reduced pumping rate as compared to a conventional dual substrate dual slot load lock chamber 900, as described in FIG. 9 above, which has a substrate transfer rate of about 60 substrates per hour. Increasing the pumping rate of the load lock chamber 900 to boost the throughput would result in condensation forming within the chamber. The reduced pumping rate of the present invention is between about 160-180 seconds per pump/vent cycles as compared to about 130 seconds per cycle of the load lock chamber 900. The substantially longer cycle reduces air velocity within the chamber, thereby reducing the probability of particular contamination of the substrate, while eliminating the condensation. Moreover, greater substrate throughput is achieved using pumps 308 having lower capacity, which contributes to reducing the system costs.

Furthermore, due to the stacked configuration of the substrate transfer chambers, greater substrate throughput is realized without increasing the footprint of the load lock chamber more than would be necessary to transfer a single substrate. A minimized footprint is highly desirable in reducing the overall cost of the FAB. Additionally, the overall height of the load lock having three single substrate transfer chambers 220, 222, 224 is less than the dual chambered system 900, further providing greater throughput in a smaller, less expensive package.

Figure 4A:
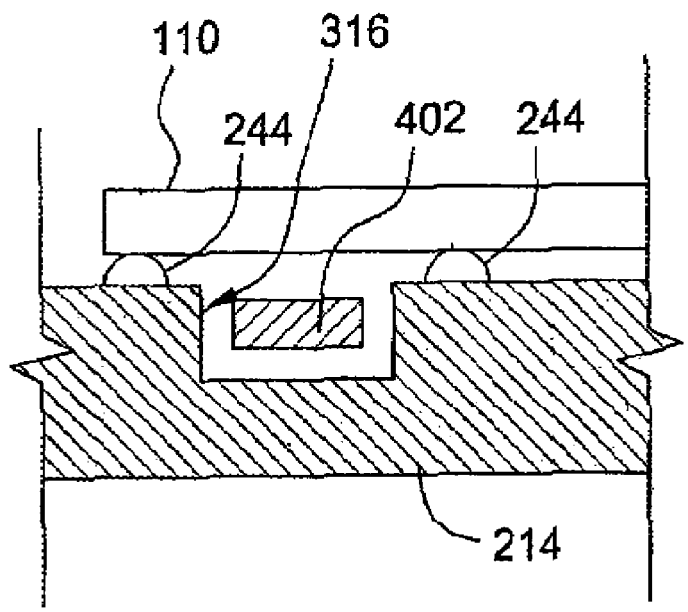
FIGS. 4A-B are partial sectional views of the load lock chamber of FIG. 3.
Figure 4B:
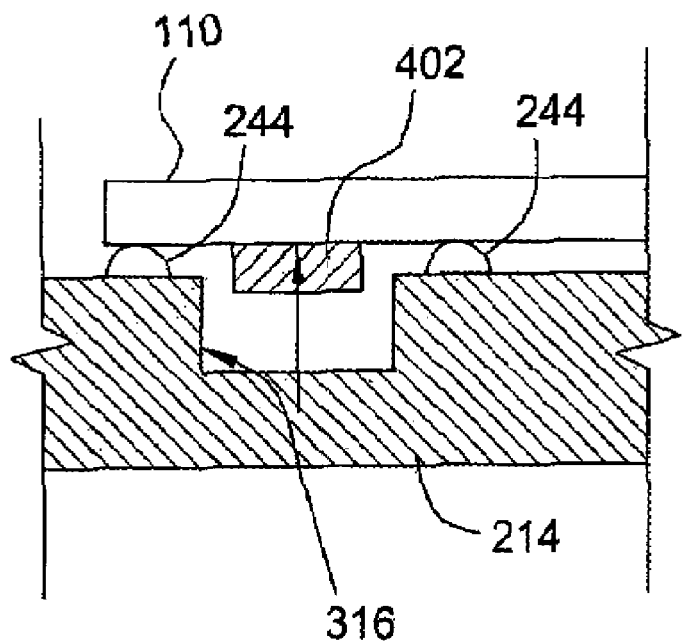

The bottom 208 of the first substrate transfer chamber 220 and the interior walls 214 bounding the bottom of the second and third substrate transfer chambers 222, 224 may also include one or more grooves 316 formed therein. As depicted in FIGS. 4A-B, the grooves 316 are configured to provide clearance between the substrate 110 disposed on the substrate supports 244 and a robot blade 402.

The blade 402 (one finger of which is shown in FIGS. 4A-B) is moved into the groove 316. Once in a predefined position within the first substrate transfer chamber 220, the blade 402 is elevated to lift the substrate 110 from the supports 244. The blade 402 carrying the substrate 110 is then retracted from the first substrate transfer chamber 220. The substrate 100 is placed on the substrate supports 244 in the reverse manner.

Figure 5:
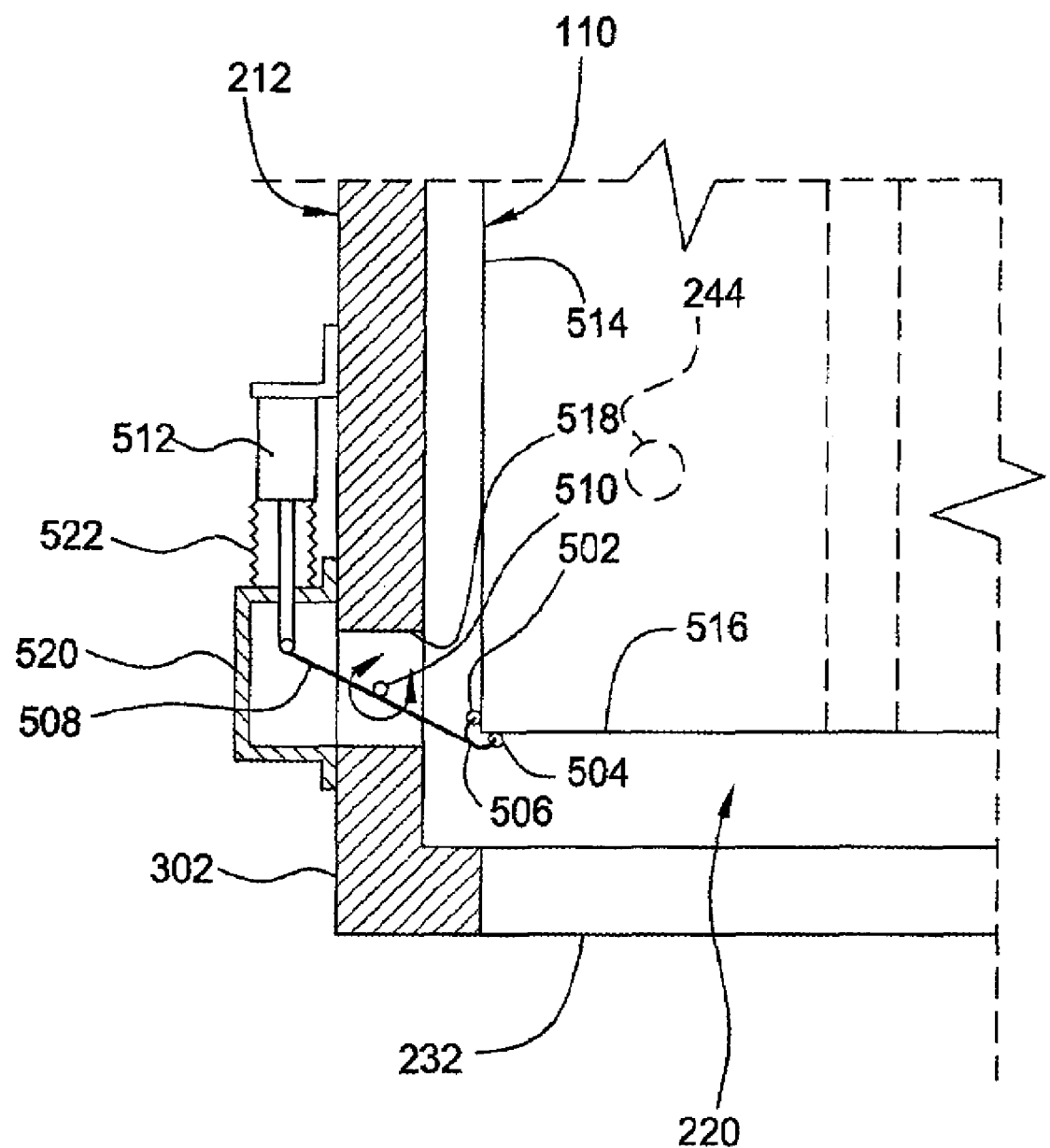
FIG. 5 is one embodiment of an alignment mechanism.

FIG. 5 is a partial sectional view of the chamber body 212 showing one embodiment of an alignment mechanism that may be utilized to urge the substrate 110 into a predefined position in the first substrate transfer chamber 220. A second alignment mechanism (not shown) is disposed in the opposite corner of the first substrate transfer chamber 220 to work in concert with the mechanism shown. Optionally, one alignment mechanism may be disposed in each corner of the first substrate transfer chamber 220. The other substrate transfer chambers 222, 226 are similarly equipped to align the substrates.

For example, the alignment apparatus may correct positional inaccuracies between a deposited position of the substrate 110 as placed by the atmospheric robot 136 on the substrate supports 244 and a predefined (i.e., designed) position of the substrate 110 relative the substrate supports 244. Having the position of the substrate 110 aligned by the alignment apparatus within the load lock chamber 100 independent from conventional correction methods that utilize the atmospheric robot 136 to adjust the substrate placement allows greater flexibility and lower system costs. For example, the substrate transfer chamber 280 with alignment apparatus provides greater compatibility between the load lock chamber 100 and user supplied factory interfaces 112 since the load lock chamber 100 is more tolerant to substrate position on the substrate supports 244, thereby reducing the need for robots of great precision and/or corrective robot motion algorithms generated by the factory interface provider. Moreover, as the positional accuracy designed criteria for the atmospheric robot 136 is diminished, less costly robots may be utilized.

In the embodiment of FIG. 5, the alignment mechanism includes two rollers 502, 504 coupled to a first end 506 of a lever 508. The lever 508 extending through a slot 518 formed through the sidewall 302 pivots about a pin 510. An actuator 512 is coupled to the lever 508 such that the rollers 502, 504 may be urged against adjacent edges 514, 516 of the substrate 110. The actuator 512, such as a pneumatic cylinder, is generally positioned on the exterior of the chamber body 212. A housing 520 is sealably disposed over the slot 518 and includes bellows or other suitable seals 522 to facilitate coupling of the actuator 512 to the lever 508 without vacuum leakage. The alignment mechanism and the opposing alignment mechanism (not shown) work in concert to position the substrate in a predefined position within the first substrate transfer chamber 220. Other substrate alignment mechanisms that may be utilized are described in U.S. patent application Ser. No. 10/094,156, filed Mar. 8, 2002, published as United States Patent Publication No. 2003/0168175 A1; and U.S. patent application Ser. No. 10/084,762, filed Feb. 22, 2002, published as United States Patent Publication No. 2003/0161706 A1, all of which are incorporated by reference in their entireties.

Figure 6:
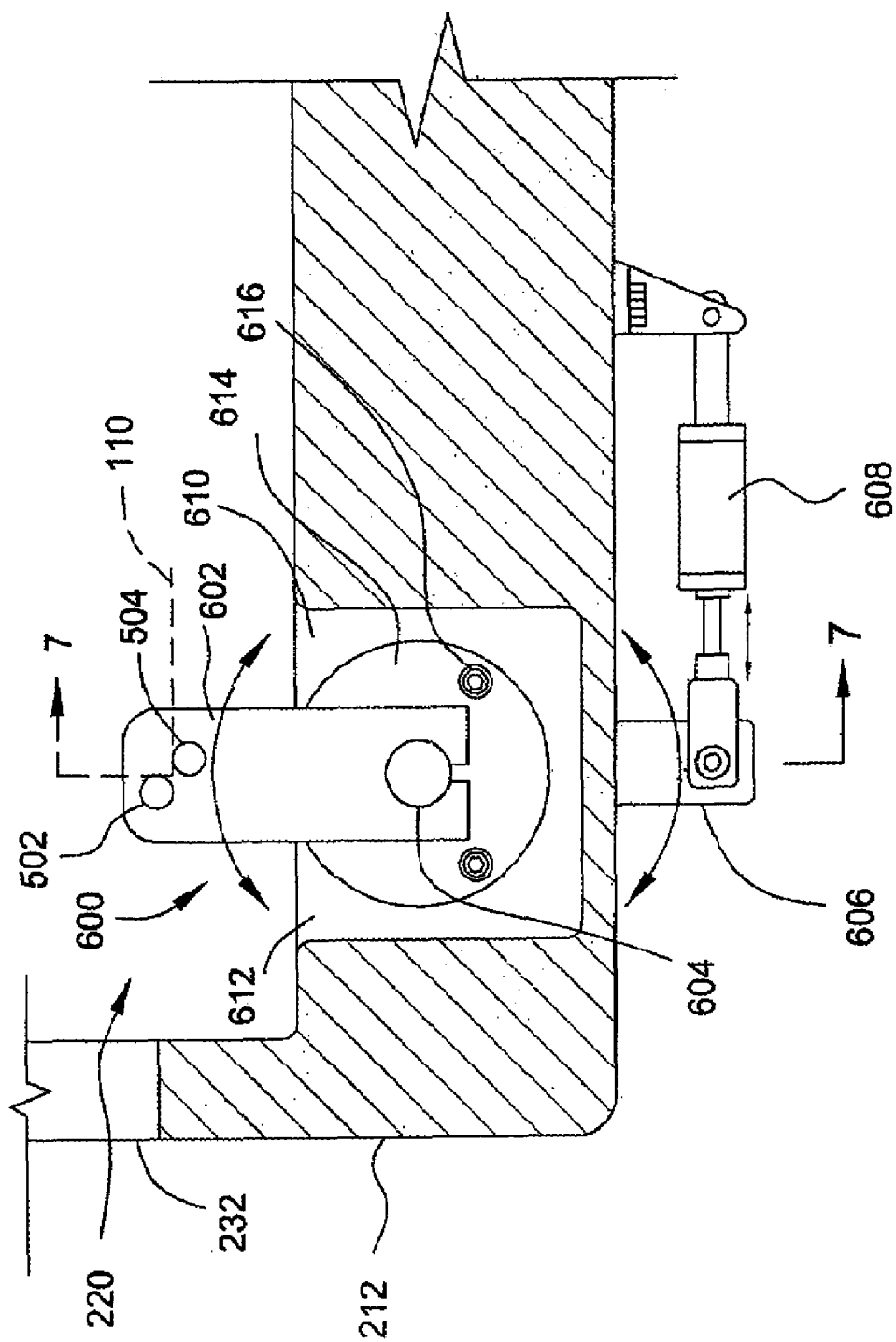
FIGS. 6-7 are sectional views of another embodiment of an alignment mechanism.
Figure 7:
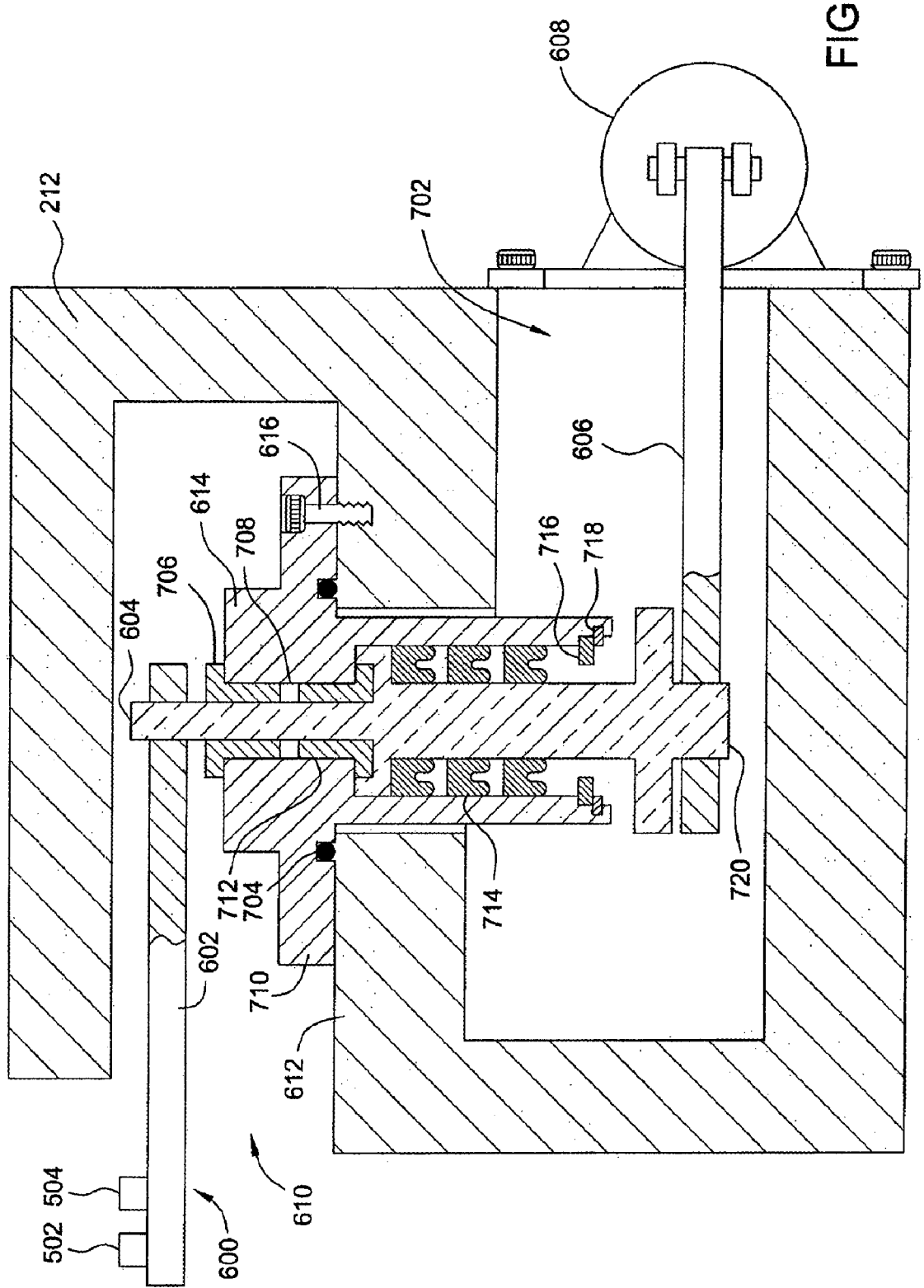

FIGS. 6-7 are sectional views of another embodiment of an alignment mechanism 600. The alignment mechanism 600 is configured to operate similar to the alignment mechanism described above. Although only one alignment mechanism 600 is shown in FIG. 6, the alignment mechanism 600 operates in concert with another alignment mechanism (not shown) disposed in the opposite corner of the chamber body 212. Optionally, each corner of the chamber body 212 may include an alignment mechanism.

The alignment mechanism 600 generally includes an interior lever 602 coupled to an actuator 608 by a shaft 604 disposed through the chamber body 212. In the embodiment depicted in FIGS. 6-7, the actuator 608 is coupled to the shaft 604 by an exterior lever 606. The exterior lever 606 is coupled to a post 720 of the shaft 604 that extended into a recess 702 defined in the exterior wall of the chamber body 212. The actuator 608 may be a motor, linear actuator or other device suitable for imparting rotary motion to the shaft 604. The interior lever 602 rotates with the shaft 604, thereby moving a pair of rollers 502, 504 extending from the lever 602 to urge a substrate 110 (shown in phantom) into a predefined position.

The shaft 604 passes through a horizontal wall 612 defining the bottom of the recess 610. The shaft 604 is disposed through a hollow housing 614 that is secured to the chamber body 212 by a plurality of fasteners 616. A pair of bushings 706, 712 are disposed in a bore 708 of the housing 614 to facilitate rotation of the shaft 604 within the housing 614. A seal 704 is disposed between a flange 710 of the housing 614 to maintain the vacuum integrity of the chamber body 212.

A plurality of seals 714 are disposed between the shaft 604 and housing 614 to prevent vacuum loss. In the embodiment depicted in FIG. 7, the seals 714 comprise three cup seals having an open end facing the exterior lever 606. The seals 714 are retained within the bore 708 by a washer 716 and retaining ring 718.

Figure 8:
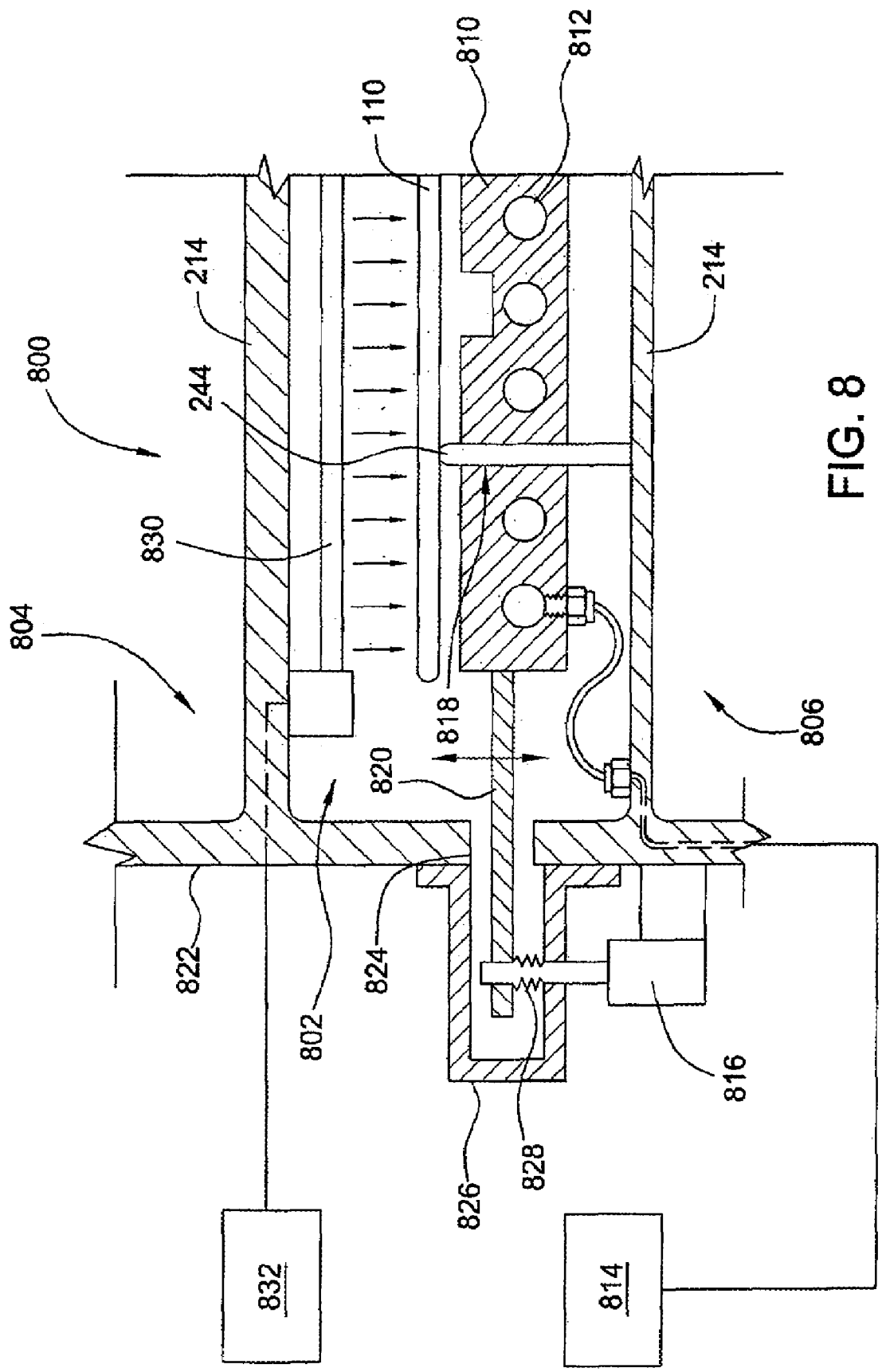
FIG. 8 is another embodiment of a load lock chamber.

FIG. 8 depicts another embodiment of a load lock chamber 800. The load lock chamber 800 is similar to the load lock chamber 100 described above and is additionally configured to provide thermal processing of the substrate 110 during pump down and/or venting of the substrate transfer chambers. In the embodiment depicted in FIG. 8, a portion of a chamber body 822 is shown having one substrate transfer chamber 802 partially detailed, while upper and lower adjacent substrate transfer chambers 804, 806 may be similarly configured.

In one embodiment, a cooling plate 810 is disposed in the substrate transfer chamber 802. The cooling plate 810 may be adapted to cool processed substrates returning to the load lock chamber 800. The cooling plate 810 may be an integral part or coupled to the interior wall 214. The cooling plate 810 includes a plurality of passages 812 coupled to a cooling fluid source 814. The cooling fluid source 814 is adapted to circulate a heat transfer fluid through the passages 812 to regulate the temperature of the substrate 110.

In the embodiment depicted in FIG. 8, the cooling plate 810 is coupled to at least one actuator 816 that controls the elevation of the plate 810 relative to the substrate 110 disposed on the substrate supports 244. The substrate supports 244 are disposed through apertures 818 formed through the cooling plate 810 to allow the cooling plate 810 to move vertically into close proximity to the substrate for enhanced heat transfer, and away from the substrate to provide access for the blade of the robot as described with reference to FIGS. 4A-B above.

The actuator 816 is coupled to the exterior of the chamber body 822 and is coupled to the cooling plate 810 by a connecting rod 820. The rod 820 passes through a slot 824 formed in chamber body 822. A housing 826 is disposed over the slot 824 and is sealably coupled to the actuator 816 and rod 820 by bellows 828 or the like to allow the actuator 816 to adjust the elevation of the cooling plate 810 without loss of vacuum from the substrate transfer chamber 802.

The substrate transfer chamber 802 may also include a heating element 830 disposed adjacent the top boundary (i.e., internal wall or top of chamber body, depending on the position of the substrate transfer chamber within the load lock chamber). In the embodiment depicted in FIG. 8, the heating element 830 is coupled to a power source 832 and is adapted to preheat unprocessed substrates, and in one embodiment is a radiant heater, such as a quartz infrared Halogen lamp or the like. It is contemplated that other heating elements may be utilized.

Thus, a load lock chamber having vertically stacked single substrate transfer chambers is provided. The configuration of vertically stacked single substrate transfer chambers contributes to reduced size and greater throughput as compared to conventional state of the art, dual slot dual substrate designs. Moreover, the increased throughput has been realized at reduced pumping and venting rates, which corresponds to reduced probability of substrate contamination due to particulates and condensation.

While the foregoing is directed to the preferred embodiment of the present invention, other and further embodiments of the invention may be devised without departing from the basic scope thereof. The scope of the invention is determined by the claims which follow.

The invention claimed is:

1. A method for transferring a large area substrate, comprising:
    transferring a large area substrate from a first robot blade through a first slit valve to a substrate support disposed in a first chamber formed within a chamber body;
    moving one or more actuators in a linear path that is in a plane parallel to the substrate;

horizontally rotating one or more lever arms about an axis of rotation that is perpendicular to the plane of the linear path in response to moving the one or more actuators;

contacting adjacent sides of the substrate at a corner region of the substrate with at least two rollers attached to one of the one or more lever arms; and urging the substrate into a predefined position on the substrate support due to the horizontally rotating the one or more lever arms.

2. The method of claim 1, wherein each of the at least two rollers has an axis of rotation substantially parallel to the axis of rotation of the one or more lever arms.

3. The method of claim 1, further comprising:
transferring a second large area substrate into a second chamber formed within the chamber body.

4. The method of claim 3, further comprising:
horizontally rotating one or more second lever arms disposed in the second chamber into contact with the substrate.

5. The method of claim 1, further comprising:
changing the pressure within the first chamber; and
transferring the substrate from the substrate support to a second robot blade extending into the first chamber through a second slit valve.

6. The method of claim 5, further comprising:
introducing at least one of $N_2$ or He to the first chamber to raise the pressure of the first chamber.

7. A method for transferring a large area substrate, comprising:
transferring a first substrate into a first chamber formed in a load lock chamber body;
moving an actuator in a linear path that is in a plane parallel to the substrate;
rotating a lever arm about an axis coplanar with a vertical wall of the chamber body;
contacting adjacent sides of the first substrate at a corner region of the first substrate due to rotating the lever arm; and
laterally positioning the first substrate within the first chamber.

8. The method of claim 7, wherein contacting adjacent sides of the first substrate further comprises:
contacting a first side of the first substrate with a first roller attached to the lever arm and having an axis of rotation substantially parallel to the axis of rotation of the lever arm; and
contacting a second side of the first substrate with a second roller attached to the lever arm and having an axis of rotation substantially parallel to the axis of rotation of the lever arm.

9. The method of claim 7, further comprising:
transferring a second substrate into a second chamber formed within the load lock chamber body.

10. The method of claim 9, further comprising:
rotating a second lever arm about an axis coplanar with the vertical wall of the chamber body into contact with the second substrate; and
laterally positioning the second substrate within the second chamber.

11. A large area substrate transferring method, comprising:
opening a first slit valve between a first transfer chamber and a second transfer chamber;
transferring a first substrate from the first transfer chamber onto a substrate support in the second transfer chamber;
moving an actuator in a linear path that is in a plane parallel to the first substrate;
horizontally rotating one or more lever arms about an axis of rotation that is perpendicular to the plane of the linear path;
laterally positioning the first substrate on the substrate support by contacting adjacent sides of the substrate in a corner region of the first substrate with at least two rollers attached to one of the one or more lever arms, each of the at least two rollers having an axis of rotation substantially parallel to the axis of rotation of the one or more lever arms;
closing the first slit valve;
introducing a venting gas to the second transfer chamber to raise the pressure of the second transfer chamber;
opening a second slit valve; and
transferring the first substrate from the second transfer chamber to a substrate storage cassette.

12. The method of claim 11, further comprising:
opening a third slit valve between the first transfer chamber and a third transfer chamber;
transferring a second substrate from the first transfer chamber into the third transfer chamber;
closing the third slit valve;
introducing a venting gas to the third transfer chamber to raise the pressure of the third transfer chamber;
opening a fourth slit valve; and
transferring the second substrate from the third transfer chamber to a substrate storage cassette.

13. The method of claim 12, further comprising:
heating the second substrate with radiant heat.

14. The method of claim 12, further comprising:
opening a fifth slit valve between the first transfer chamber and a fourth transfer chamber;
transferring a third substrate from the first transfer chamber into the fourth transfer chamber;
closing the fifth slit valve;
introducing a venting gas to the fourth transfer chamber to raise the pressure of the fourth transfer chamber;
opening a sixth slit valve; and
transferring the third substrate from the fourth transfer chamber to a substrate storage cassette.

15. The method of claim 14, wherein the fourth, second and third transfer chambers are each coupled with individual vacuum pumps.

16. The method of claim 14, wherein at least two of the fourth, second and third transfer chambers share a single vacuum pump.

17. The method of claim 16, wherein the fourth, second and third transfer chambers share a single vacuum pump.

18. The method of claim 14, further comprising:
heating the third substrate with radiant heat.

19. The method of claim 11, wherein the venting gas is at least one of $N_2$ or He.

20. The method of claim 11, further comprising:
heating the first substrate with radiant heat.

* * * * *